United States Patent
Chiu et al.

(10) Patent No.: US 7,548,456 B2
(45) Date of Patent: Jun. 16, 2009

(54) COMBO MEMORY CELL

(75) Inventors: Chih-Kang Chiu, Hsinchu County (TW); Wei-Chiang Shih, Taipei (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 58 days.

(21) Appl. No.: 11/772,299

(22) Filed: Jul. 2, 2007

(65) Prior Publication Data

US 2009/0010053 A1    Jan. 8, 2009

(51) Int. Cl.
*G11C 11/34* (2006.01)

(52) U.S. Cl. .................. 365/182; 365/189.05; 365/205; 365/185.17; 365/49.11

(58) Field of Classification Search .................. 365/182, 365/154–156, 94–105, 189.05, 205, 185.17, 365/49.11
See application file for complete search history.

(56) References Cited

U.S. PATENT DOCUMENTS 5,923,582 A * 7/1999 Voss ............................ 365/154
7,023,744 B1   4/2006 Shimanek et al.
2006/0198204 A1 * 9/2006 Lambrache et al. ..... 365/189.01

\* cited by examiner

*Primary Examiner*—Pho M. Luu
*Assistant Examiner*—Tha-o Bui
(74) *Attorney, Agent, or Firm*—Winston Hsu

(57) ABSTRACT

A combo memory cell having a SRAM cell and a mask-ROM code programmer. The SRAM cell comprises first and second inverters. The first inverter comprises a first PMOS transistor and a first NMOS transistor. Gates of the first PMOS and NMOS transistors are commonly connected to a first input node and drains thereof commonly connected to a first output node. The second inverter comprises a second PMOS transistor and a second NMOS transistor. Gates of the second PMOS and NMOS transistors are commonly connected to a second input node and drains thereof commonly connected to a second output node. The first input node and the second output node are connected, as are the second input node and the first output node. The mask-ROM code programmer is coupled to the sources of the first and second PMOS transistors or the first and second NMOS transistors.

20 Claims, 20 Drawing Sheets

COMBO MEMORY CELL

BACKGROUND OF THE INVENTION

1. Field of the Invention

The invention relates to a memory cell and, in particular, to a combo memory cell having a random access mode and a read only mode.

2. Description of the Related Art

Random access memories (RAMs) and read only memories (ROMs) are semiconductor memories commonly used in an electronic system. Generally, different blocks are respectively used for RAM and ROM in conventional chip design.

FIG. 1 is a circuit diagram illustrating a programmable logic device (PLD) disclosed in U.S. Pat. No. 7,023,744. As shown in FIG. 1, the PLD is a reconfigurable SRAM-ROM cell. The combo memory cell comprises a SRAM cell and a ROM cell. The SRAM cell comprises cross coupled inverters 320 and 325 and pass transistors 335. A gate of the pass transistor 335 is controlled by a mode switch signal MC. When a logic state of the mode switch signal MC is "low", the pass transistor 335 is turned off. When a logic state of the mode switch signal MC is "high", the pass transistor 335 is turned on. Thus, one of the input/output nodes CB/CBb of the cross coupled inverters 320 and 325 is pulled to ground via an interconnection 340 and the pass transistor 335 and the combo memory cell is in a read only mode. States of the input/output nodes CB/CBb of the cross coupled inverters 320 and 325 determine a memory state of the combo memory cell.

In the conventional combo memory cell disclosed in U.S. Pat. No. 7,023,744, the ROM code directly programs the input/output nodes CB/CBb of the cross coupled inverters 320 and 325. Compared with a conventional SRAM cell, an extra transistor 335 is required in the conventional combo memory cell.

BRIEF SUMMARY OF THE INVENTION

An embodiment of a combo memory cell has a random access mode and a read only mode. The combo memory cell also has first and second logic states wherein voltage level of the first logic state exceeds the second logic state. The combo memory cell comprises a static random access memory (SRAM) cell and a mask read only memory (mask-ROM) code programmer. The SRAM cell comprises first and second inverters. The first inverter comprises a first PMOS transistor and a first NMOS transistor. Gates of the first PMOS and NMOS transistors are commonly connected to a first input node and drains thereof commonly connected to a first output node. The second inverter comprises a second PMOS transistor and a second NMOS transistor. Gates of the second PMOS and NMOS transistors are commonly connected to a second input node and drains thereof commonly connected to a second output node. The first input node and the second output node are connected, as are the second input node and the first output node. The mask-ROM code programmer is coupled to the sources of the first and second PMOS transistors or the first and second NMOS transistors.

An embodiment of a combo memory cell has a random access mode and a read only mode. The combo memory cell also has first and second logic states wherein voltage level of the first logic state exceeds the second logic state. The combo memory cell comprises a SRAM cell and first and second mask-ROM code programmers. The SRAM cell comprises first and second inverters. The first inverter comprises a first PMOS transistor and a first NMOS transistor. Gates of the first PMOS and NMOS transistors are commonly connected to a first input node and drains thereof commonly connected to a first output node. The second inverter comprises a second PMOS transistor and a second NMOS transistor. Gates of the second PMOS and NMOS transistors are commonly connected to a second input node and drains thereof commonly connected to a second output node. Sources of the second PMOS and NMOS transistors are respectively coupled to the first and second logic states. The first input node and the second output node are connected, as are the second input node and the first output node. The first and second mask-ROM code programmers are coupled to the sources of the first PMOS and NMOS transistors.

An embodiment of a combo memory cell has a random access mode and a read only mode. The combo memory cell also has first and second logic states wherein voltage level of the first logic state exceeds the second logic state. The combo memory cell comprises a SRAM cell and a mask-ROM code programmer. The SRAM cell comprises first, second and third MOS transistors. The first MOS transistor has a source coupled to a write bit line and a gate coupled to a write word line. The second MOS transistor has a gate coupled to a drain of the first MOS transistor. The third MOS transistor has a source coupled to a drain of the second MOS transistor, a gate coupled to a read word line, and a drain coupled to a read bit line. The mask-ROM code programmer is coupled to the source of the second MOS transistor.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
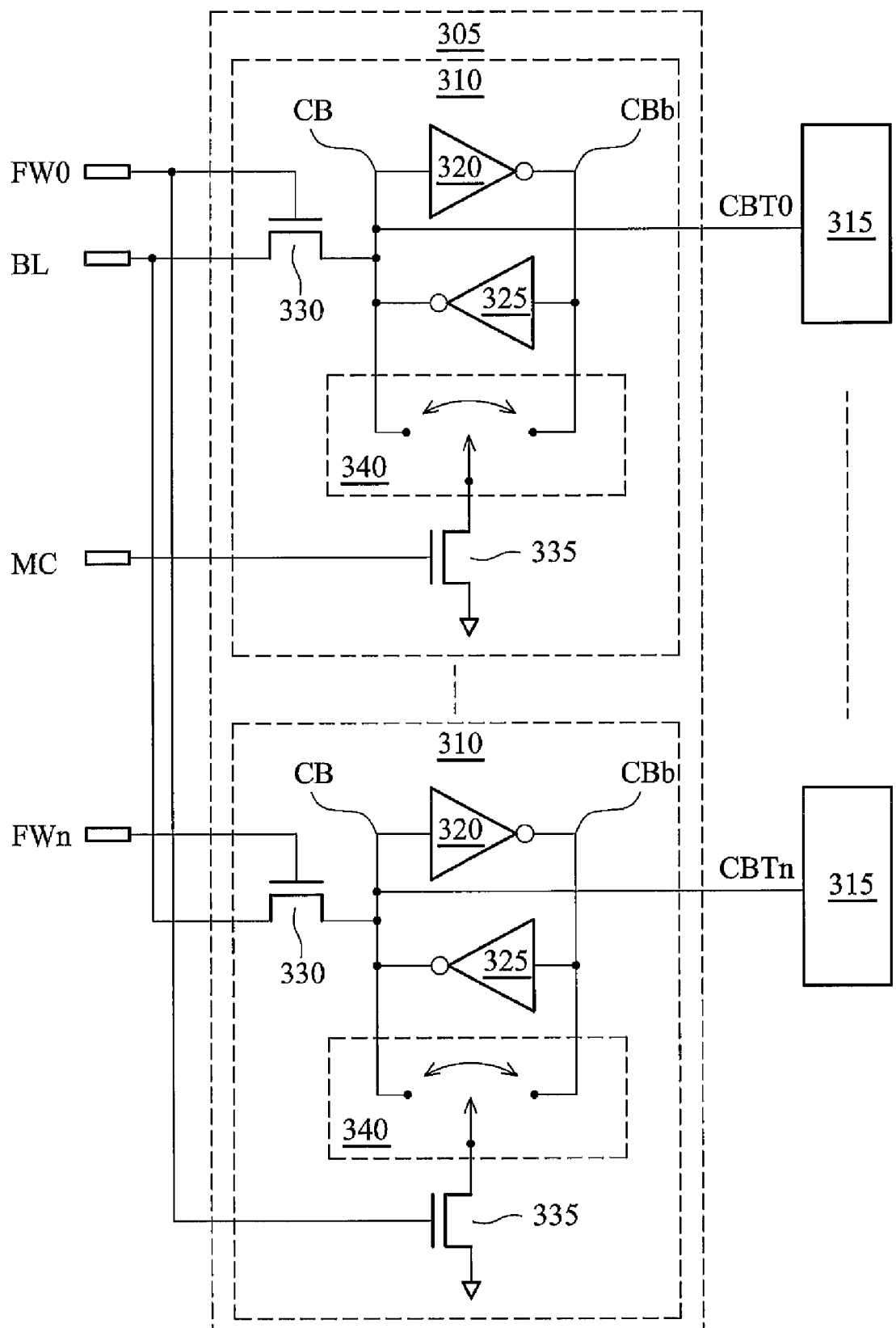
FIG. 1 is a circuit diagram illustrating a conventional combo memory cell as disclosed in U.S. Pat. No. 7,023,744.
Figure 2:
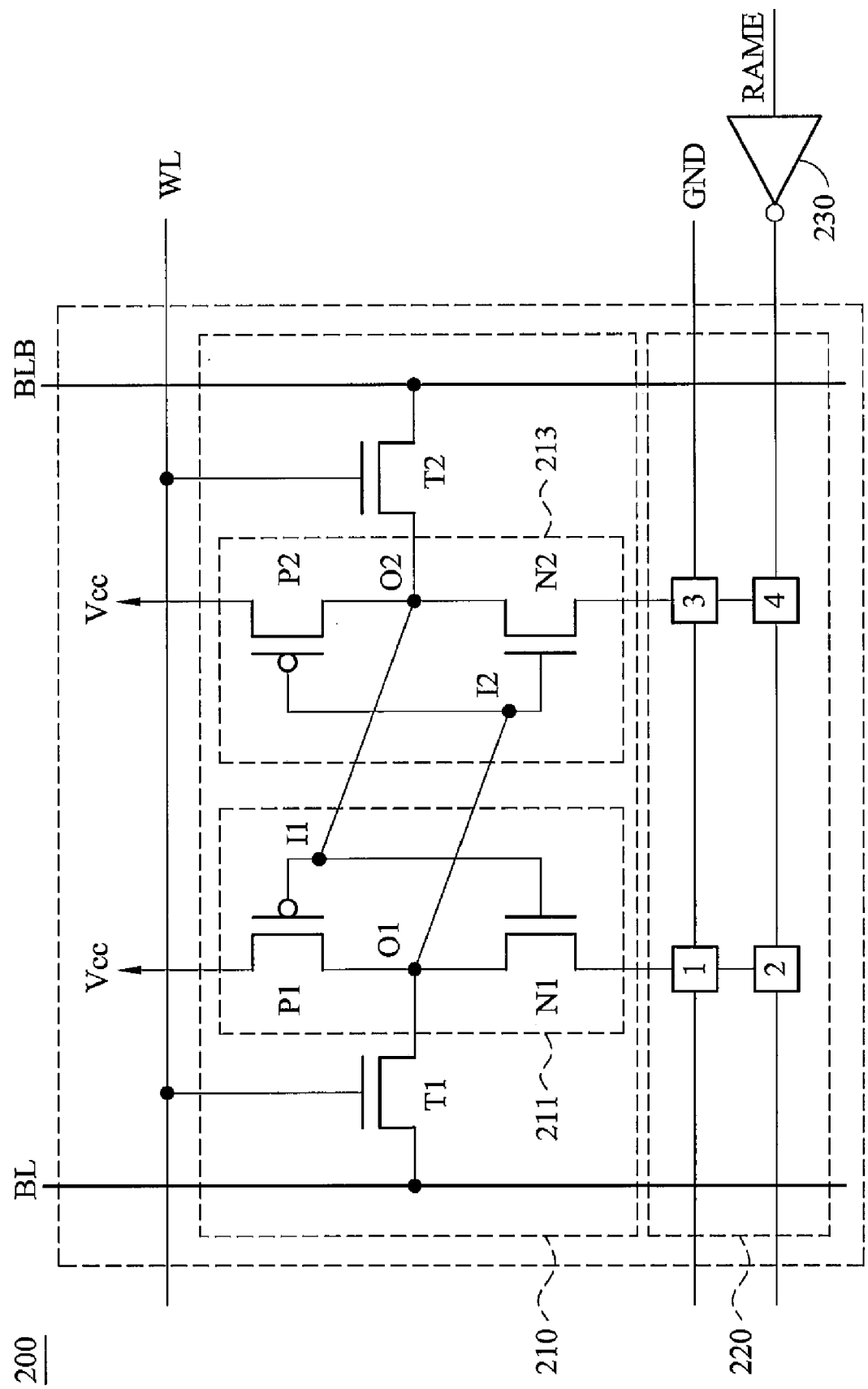
FIG. 2 is a circuit diagram of a combo memory cell according to an embodiment of the invention.

FIG. 2 is a circuit diagram of a combo memory cell according to an embodiment of the invention. The combo memory cell 200 has a random access mode and a read only mode. The combo memory cell also has first and second logic states wherein voltage level of the first logic state Vcc exceeds the second logic state GND. The combo memory cell 200 comprises a static random access memory (SRAM) cell 210 and a mask read only memory (mask-ROM) code programmer 220. The SRAM cell 210 comprises first and second inverters 211 and 213 and first and second access transistors T1 and T2. The first inverter 211 comprises a first PMOS transistor P1 and a first NMOS transistor N1. Gates of the first PMOS transistor P1 and the first NMOS transistor N1 are commonly connected to a first input node I1 and drains thereof commonly connected to a first output node O1. The second inverter 213 comprises a second PMOS transistor P2 and a second NMOS transistor N2. Gates of the second PMOS transistor P2 and the second NMOS transistor N2 are commonly connected to a second input node I2 and drains thereof commonly connected to a second output node O2. Sources of the first PMOS transistor P1 and the second PMOS transistor P2 are commonly coupled to a supply voltage Vcc. The first input node I1 and the second output node O2 are connected, as are the second input node I2 and the first output node O1. The first access transistor T1 is coupled between a bit line BL and the first output node O1 and the second access transistor T2 coupled between a complementary bit line BLB and the second output node O2. Gates of the first and second access transistors T1 and T2 are controlled by a word line WL. The mask-ROM code programmer 220 is coupled to the sources of the first and second NMOS transistors N1 and N2. The mask-ROM code programmer 220 comprises programmable interconnections 1, 2, 3 and 4. The programmable interconnections 1 and 3 selectively couple the sources of the first and second NMOS transistors N1 and N2 to a ground GND, respectively. The programmable interconnections 2 and 4 selectively couple the sources of the first and second NMOS transistors N1 and N2 to a control signal RAME (via an inverter 230), respectively. The programmable interconnections 1, 2, 3, and 4 can be a diffusion layer, a contact layer, a via layer, a metal layer, or the like.

Figure 3A:
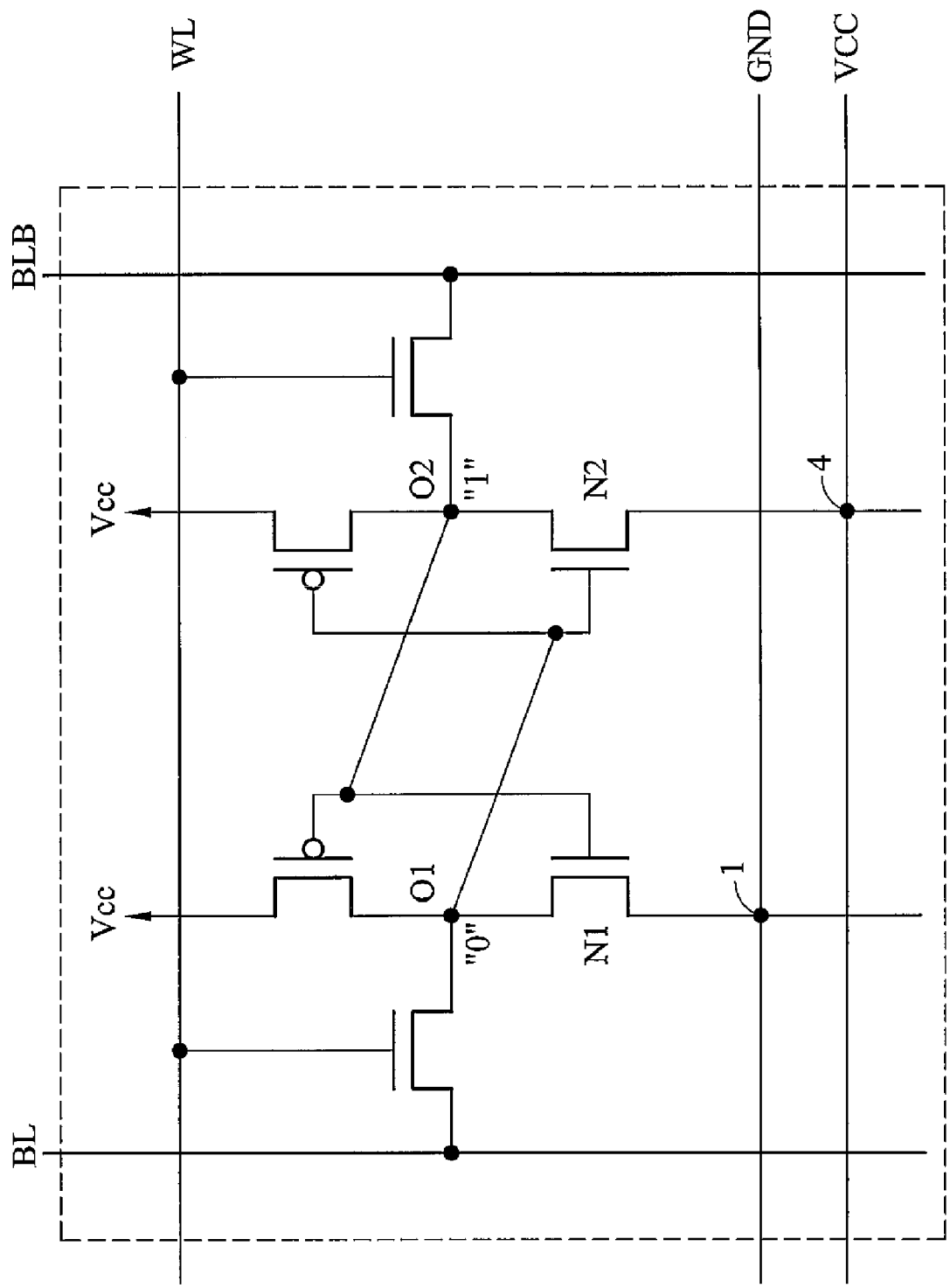
FIGS. 3A and 3B are schematic diagrams of the combo memory cell 200 in FIG. 2 in a read only mode.

FIG. 3A is a schematic diagram of the combo memory cell 200 in FIG. 2 in a read only mode. A logic state of the control signal RAME is "0". The sources of the first and second NMOS transistors N1 and N2 are coupled to the ground GND or the supply voltage Vcc via the programmable interconnections 1, 2, 3, and 4. In FIG. 3A, the source of the first NMOS transistor N1 is coupled to the ground GND via the programmable interconnection 1 and that of the second NMOS transistor N2 coupled to the supply voltage Vcc via the programmable interconnection 4. Since two ends of the second inverter 213 are both coupled to the supply voltage Vcc, a logic state of the second output node O2 is "1", and a logic state of the first output node O1 is "0". As a result, the combo memory cell 200 is in a read only mode and a memory state thereof is "0".

Figure 3B:
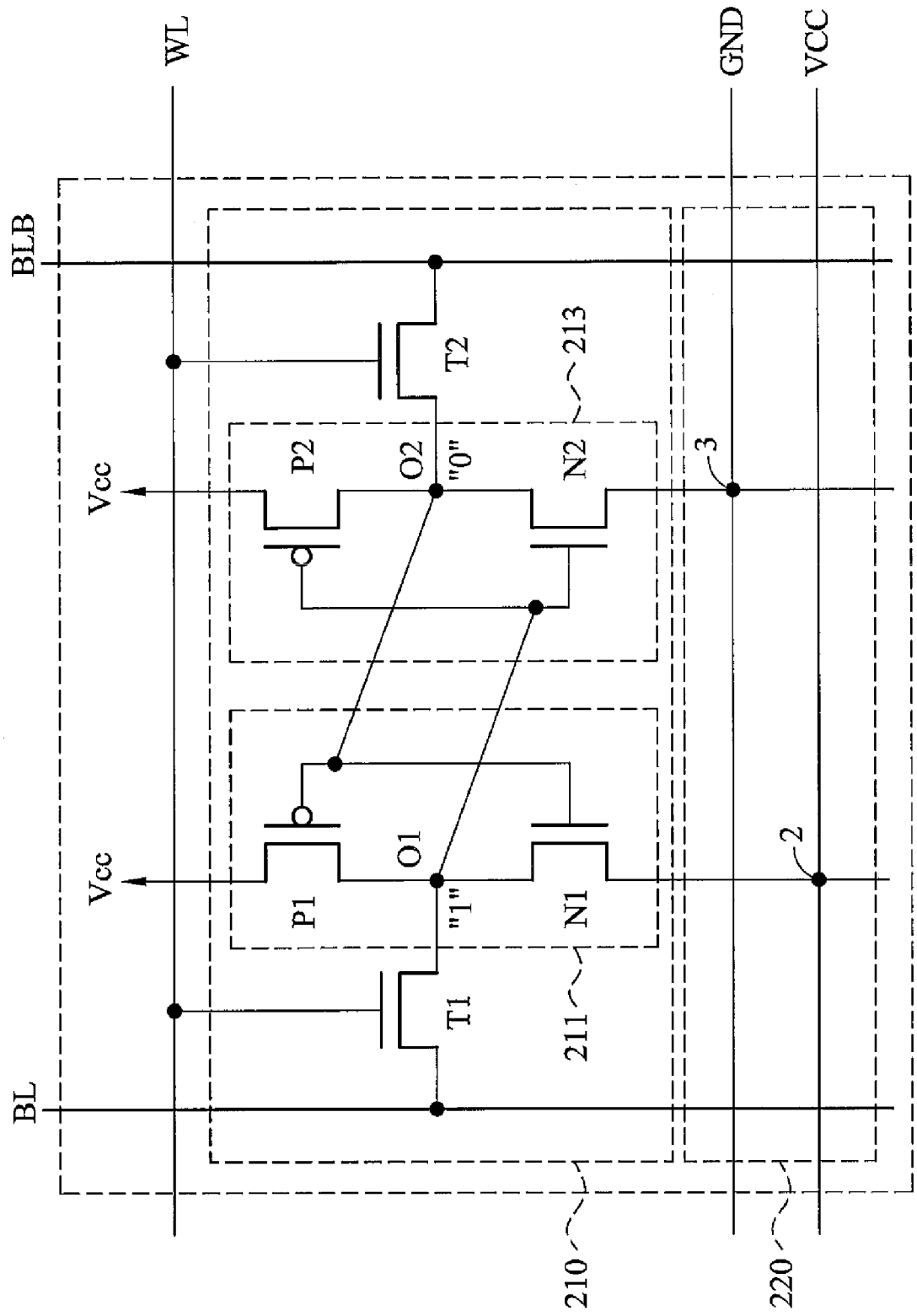

FIG. 3B is a schematic diagram of the combo memory cell 200 in FIG. 2 in a read only mode. A logic state of the control signal RAME is "0". The sources of the first and second NMOS transistors N1 and N2 are coupled to the ground GND or the supply voltage Vcc via the programmable interconnections 1, 2, 3, and 4. In FIG. 3B, the source of the first NMOS transistor N1 is coupled to the supply voltage Vcc via the programmable interconnection 2 and that of the second NMOS transistor N2 coupled to ground GND via the programmable interconnection 3. Since two ends of the first inverter 211 are both coupled to the supply voltage Vcc, a logic state of the first output node O1 is "1", and a logic state of the second output node O2 is "0". As a result, the combo memory cell 200 is in a read only mode and a memory state thereof is "1".

Figure 3C:
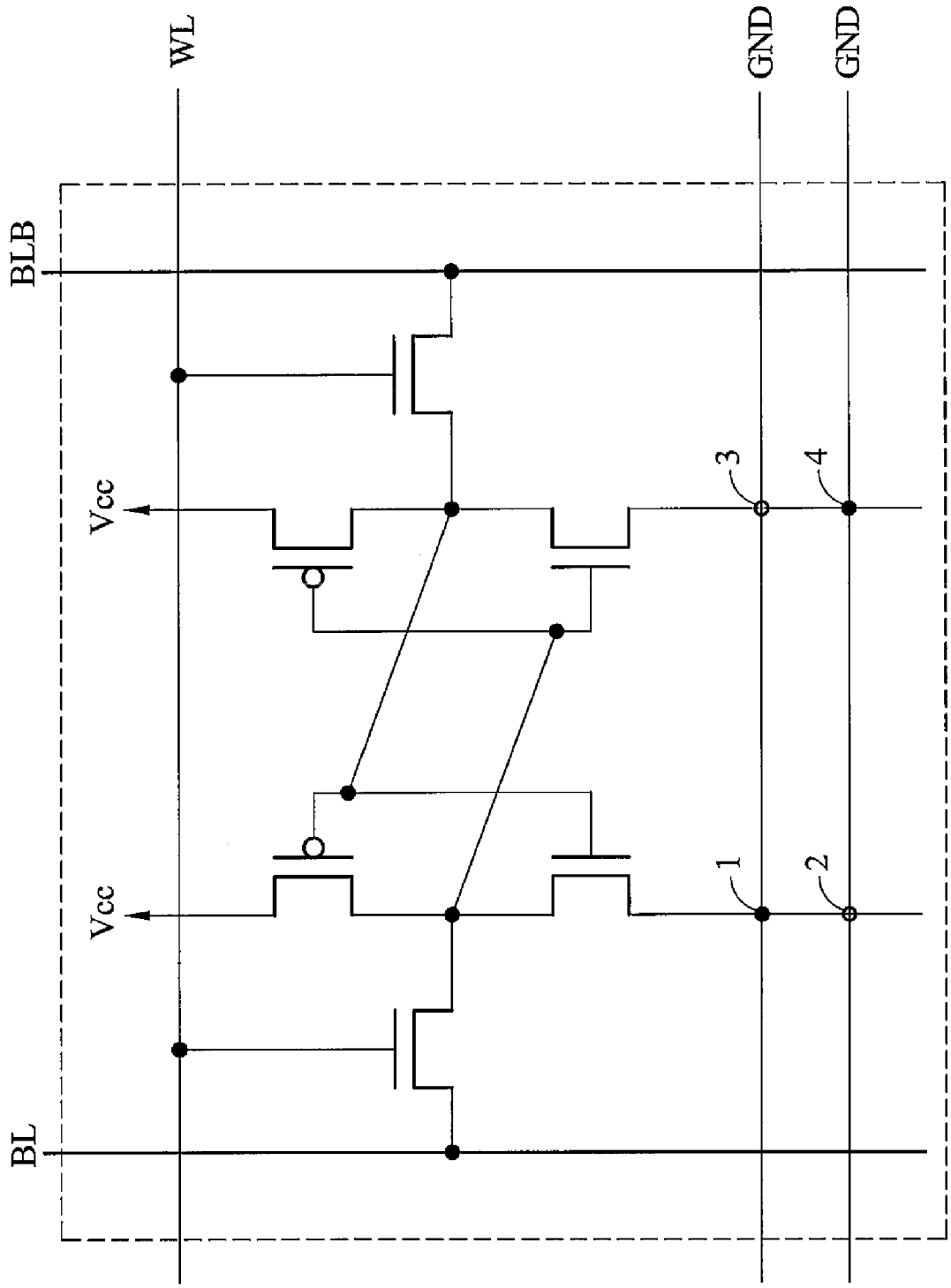
FIG. 3C is a schematic diagram of the combo memory cell 200 in FIG. 2 in a random access mode.

FIG. 3C is a schematic diagram of the combo memory cell 200 in FIG. 2 in a random access mode. A logic state of the control signal RAME is "1". The sources of the first and second NMOS transistors N1 and N2 are coupled to the ground GND or the supply voltage Vcc via the programmable interconnections 1, 2, 3, and 4. In FIG. 3C, the source of the first NMOS transistor N1 is coupled to the ground GND via the programmable interconnection 1 and that of the second NMOS transistor N2 coupled to ground GND via the programmable interconnection 4. Thus, a configuration of the combo memory cell 200 is the same as a 6T static random access memory (6T-SRAM). As a result, the combo memory cell 200 is in a random access mode.

Figure 4:
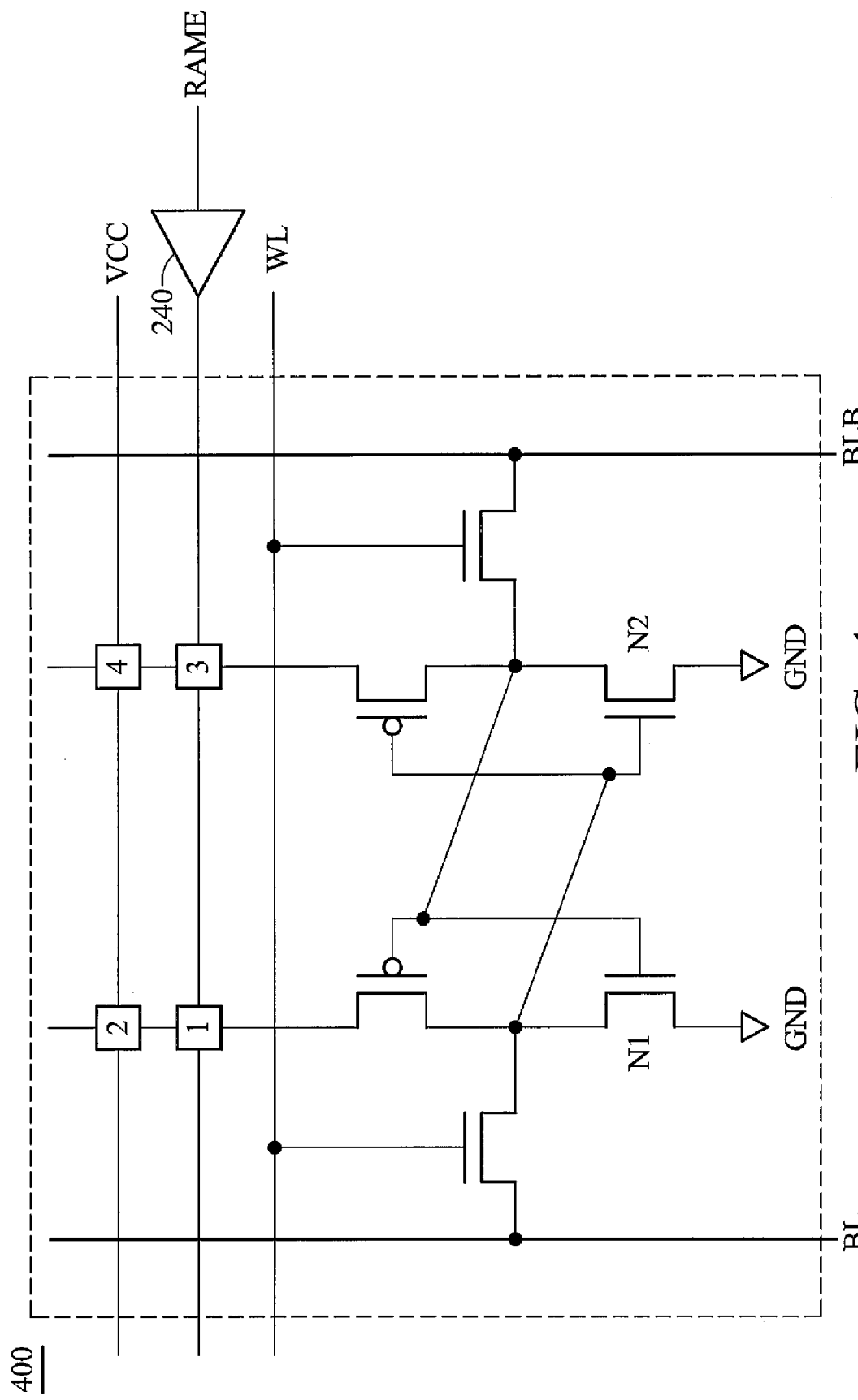
FIG. 4 is a circuit diagram of a variant of the combo memory cell 200 in FIG. 2.

FIG. 4 is a circuit diagram of a variant of the combo memory cell 200 in FIG. 2. The combo memory cell 400 only differs from that in FIG. 2 in that the sources of the first and second NMOS transistors N1 and N2 are coupled to the ground GND and the mask-ROM code programmer 220 coupled to the sources of the first and second PMOS transistor P1 and P2. The mask-ROM code programmer 220 comprises programmable interconnections 1, 2, 3 and 4. The programmable interconnections 2 and 4 selectively couple the sources of the first and second PMOS transistors P1 and P2 to a supply voltage Vcc, respectively. The programmable interconnections 1 and 3 selectively couple the sources of the first and second PMOS transistors P1 and P2 to a control signal RAME (via a buffer 240), respectively. If the sources of the first and second PMOS transistors P1 and P2 are coupled to the supply voltage Vcc via the mask-ROM code programmer 220, the combo memory cell 400 is in a random access mode. If the sources of the first and second PMOS transistors P1 and P2 are coupled to different voltage levels (the supply voltage Vcc and the ground GND) via the mask-ROM code programmer 220, the combo memory cell 400 is in a read only mode.

Figure 5A:
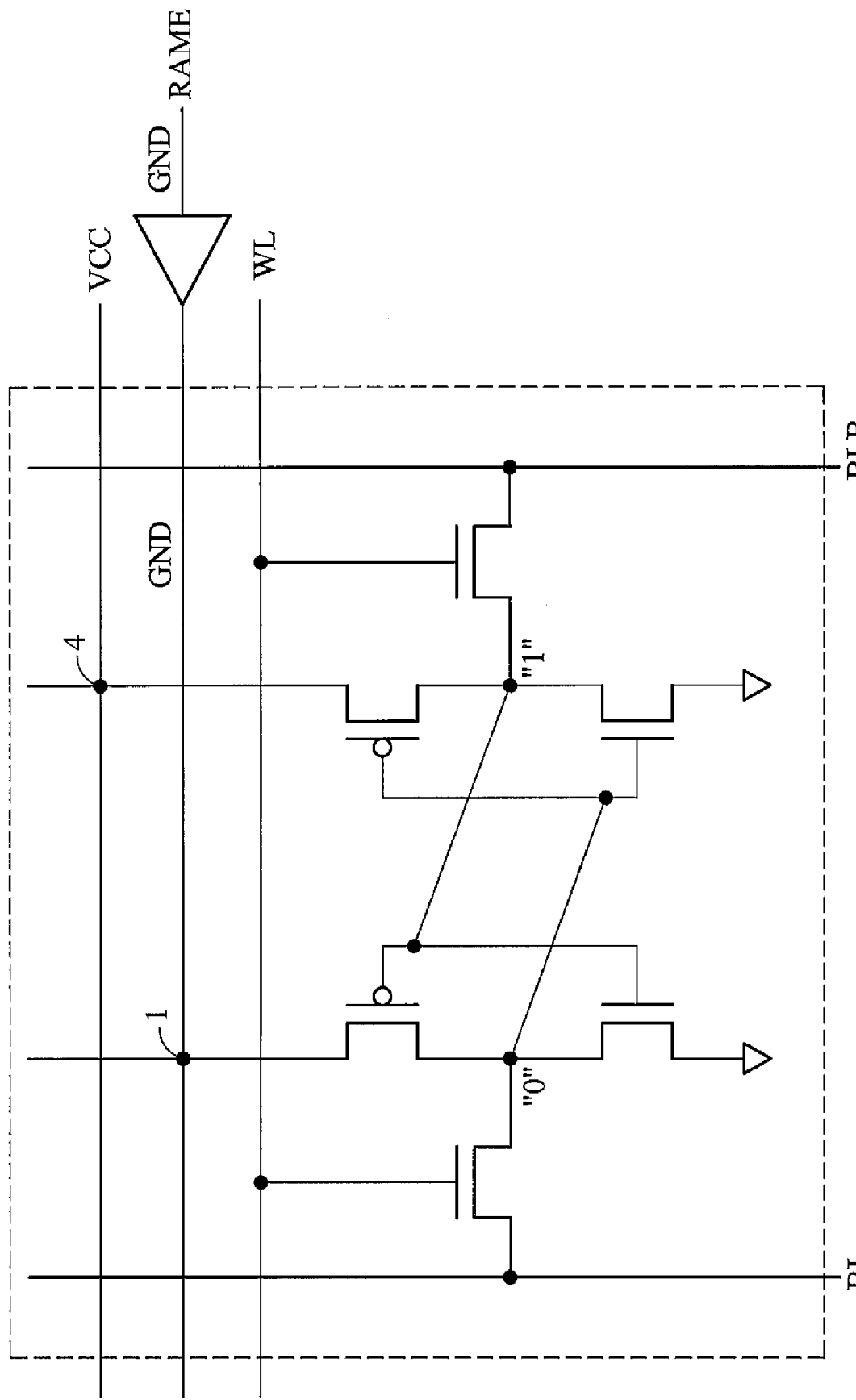
FIGS. 5A and 5B are schematic diagrams of the combo memory cell 400 in FIG. 4 in a read only mode.

FIG. 5A is a schematic diagram of the combo memory cell 400 in FIG. 4 in a read only mode. A logic state of the control signal RAME is "0". The sources of the first and second PMOS transistors P1 and P2 are coupled to the ground GND or the supply voltage Vcc via the programmable interconnections 1, 2, 3, and 4. In FIG. 5A, the source of the first PMOS transistor P1 is coupled to the ground GND via the programmable interconnection 1 and that of the second PMOS transistor P2 coupled to the supply voltage Vcc via the programmable interconnection 4. Since two ends of the first inverter 211 are both coupled to the ground GND, a logic state of the first output node O1 is "0", and a logic state of the second output node O2 is "1". As a result, the combo memory cell 400 is in a read only mode and a memory state thereof is "0".

Figure 5B:
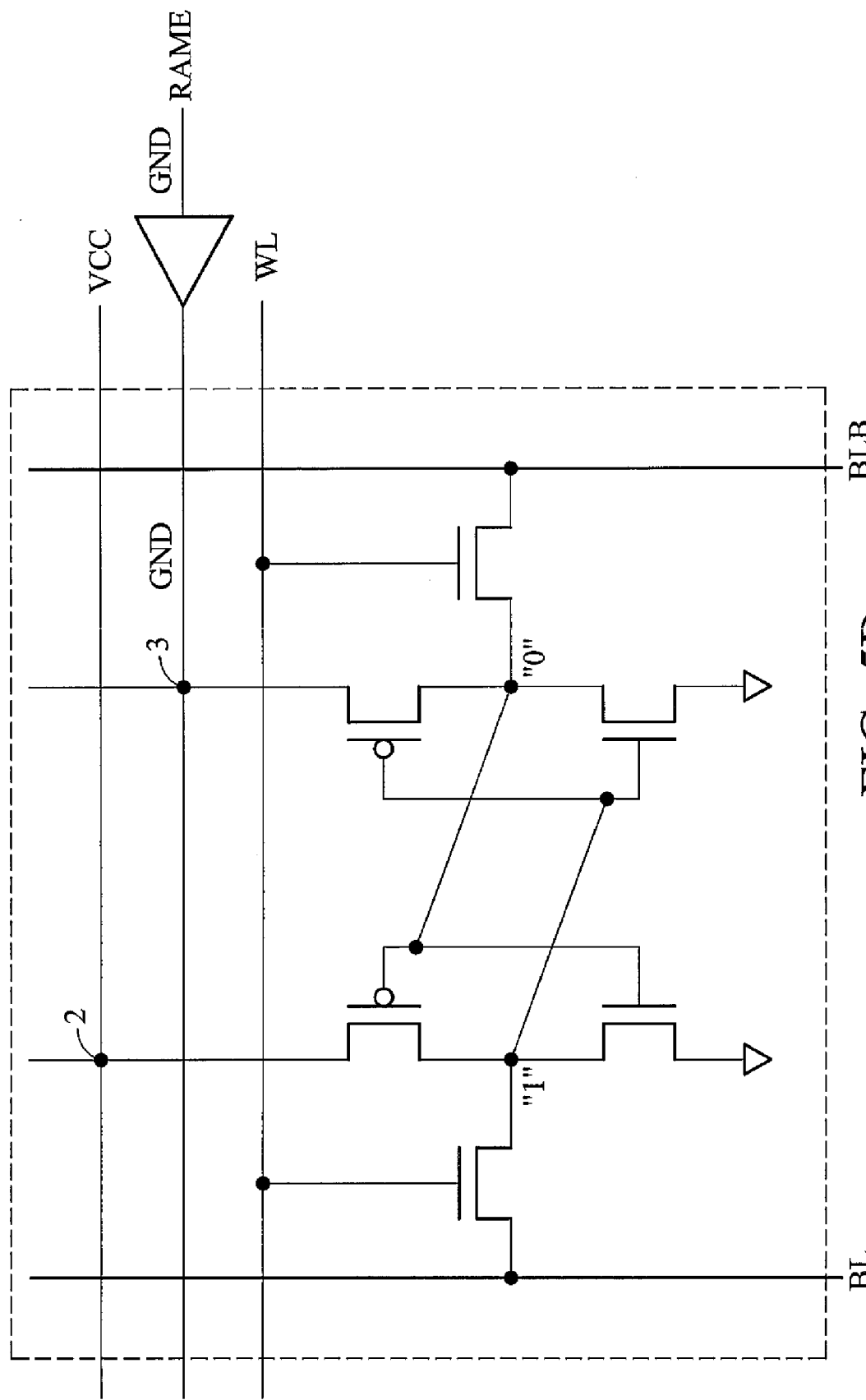

FIG. 5B is a schematic diagram of the combo memory cell 400 in FIG. 4 in a read only mode. A logic state of the control signal RAME is "0". The sources of the first and second PMOS transistors P1 and P2 are coupled to the ground GND or the supply voltage Vcc via the programmable interconnections 1, 2, 3, and 4. In FIG. 5B, the source of the first PMOS transistor P1 is coupled to the supply voltage Vcc via the programmable interconnection 2 and that of the second PMOS transistor P2 coupled to ground GND via the programmable interconnection 3. Since two ends of the second inverter 213 are both coupled to the ground GND, a logic state of the second output node O2 is "0", and a logic state of the first output node O1 is "1". As a result, the combo memory cell 400 is in a read only mode and a memory state thereof is "1".

Figure 5C:
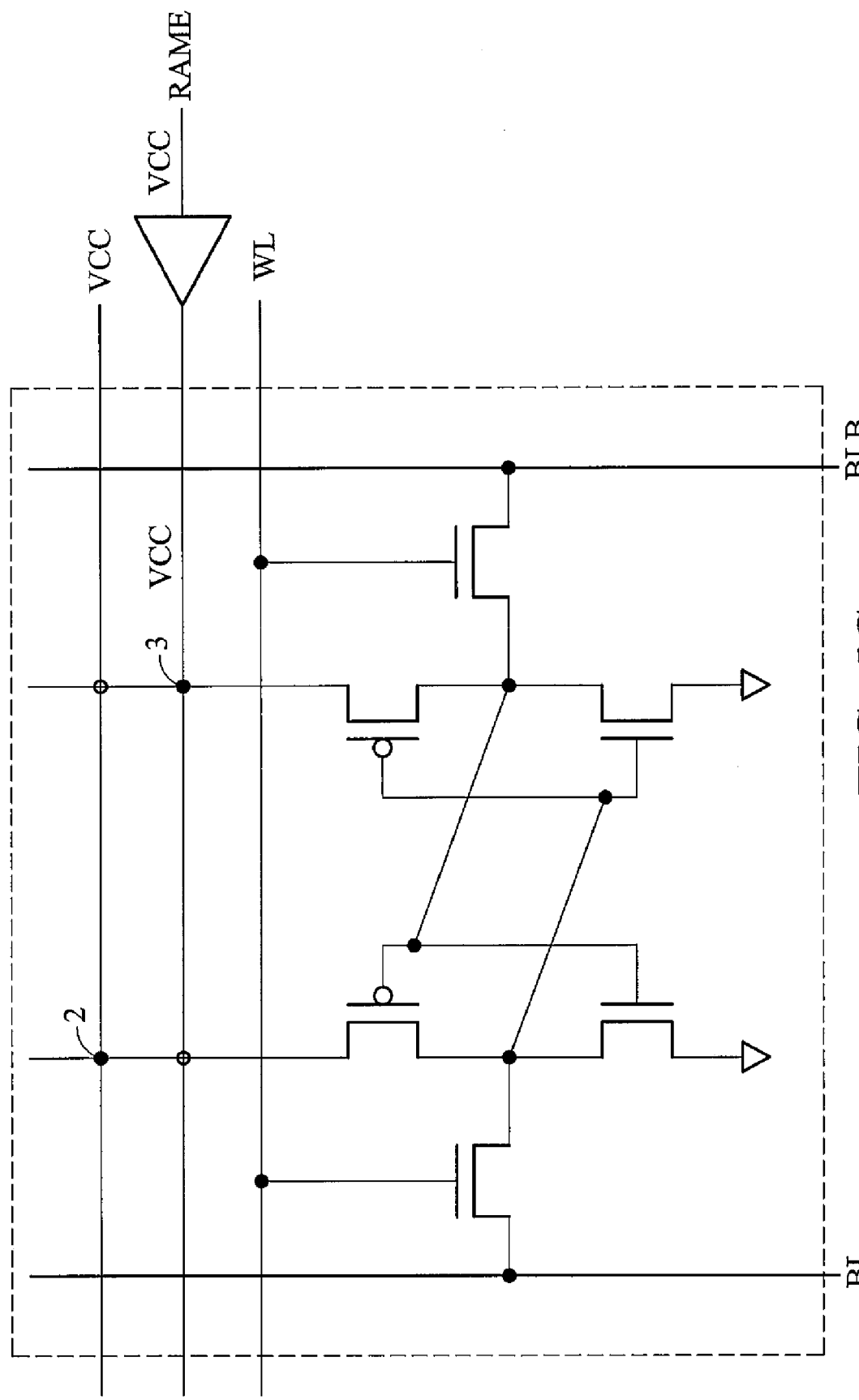
FIG. 5C is a schematic diagram of the combo memory cell 400 in FIG. 4 in a random access mode.

FIG. 5C is a schematic diagram of the combo memory cell 400 in FIG. 4 in a random access mode. A logic state of the control signal RAME is "1". The sources of the first and second PMOS transistors P1 and P2 are coupled to the ground GND or the supply voltage Vcc via the programmable interconnections 1, 2, 3, and 4. In FIG. 5C, the source of the first PMOS transistor P1 is coupled to the supply voltage Vcc via the programmable interconnection 2 and that of the second PMOS transistor P2 coupled to the supply voltage via the programmable interconnection 3. Thus, a configuration of the combo memory cell 400 is the same as a 6T static random access memory (6T-SRAM). As a result, the combo memory cell 400 is in a random access mode.

Figure 6A:
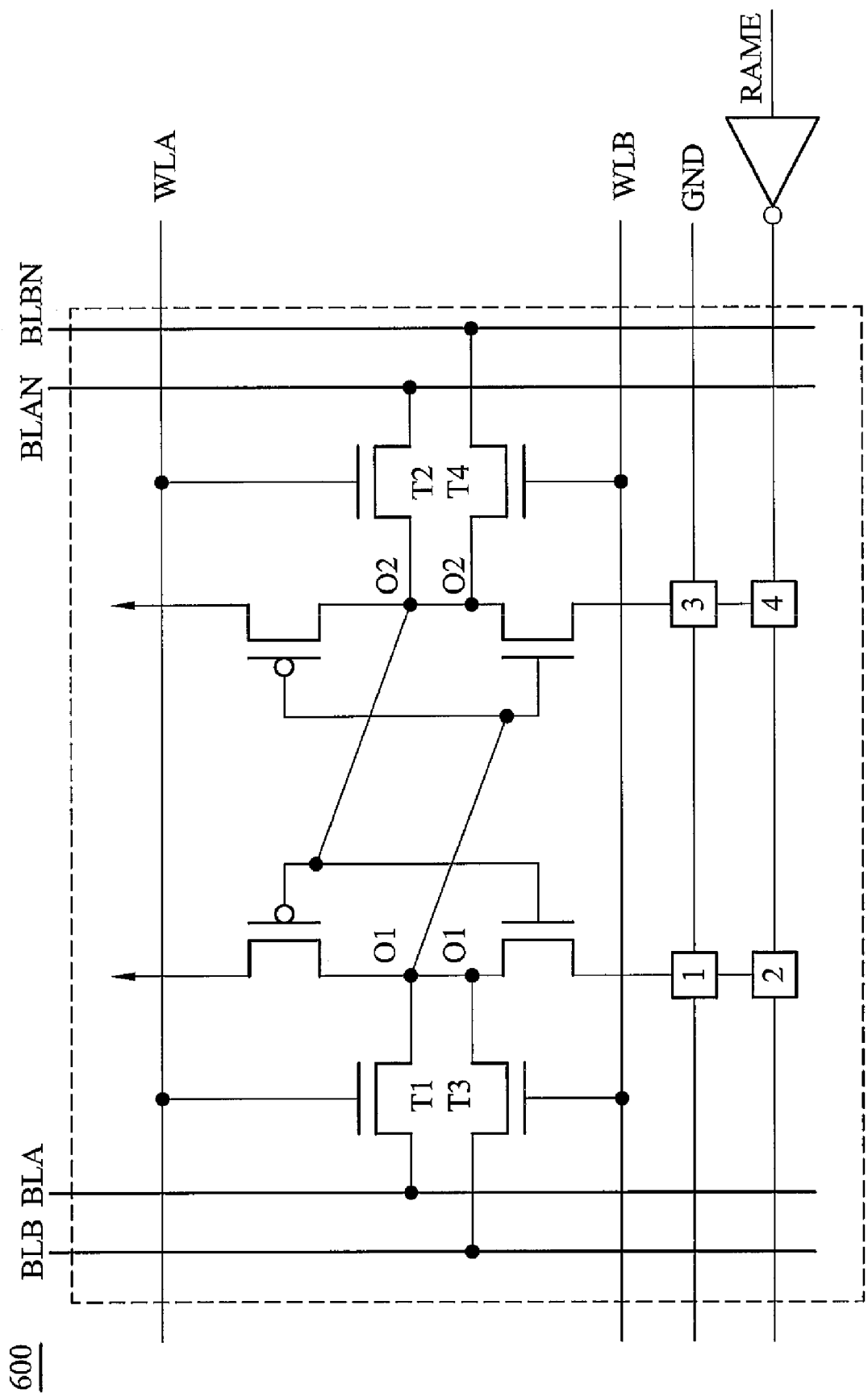
FIG. 6A is a circuit diagram of a variant of the combo memory cell 200 in FIG. 2.

FIG. 6A is a circuit diagram of a variant of the combo memory cell 200 in FIG. 2, differing only in that the first access transistor T1 is coupled between a first bit line BLA and the first output node O1 and the second access transistor T2 coupled between a first complementary bit line BLAN and the second output node O2. Gates of the first and second access transistors T1 and T2 are controlled by a first word line WLA. In addition, the combo memory cell 600 further comprises third and fourth access transistors T3 and T4. The third access transistor T3 is coupled between the first output node O1 and a second bit line BLB and the fourth access transistor T4 coupled between the second output node O2 and a second complementary bit line BLBN. Gates of the third and fourth access transistors T3 and T4 are controlled by a second word line WLB.

Figure 6B:
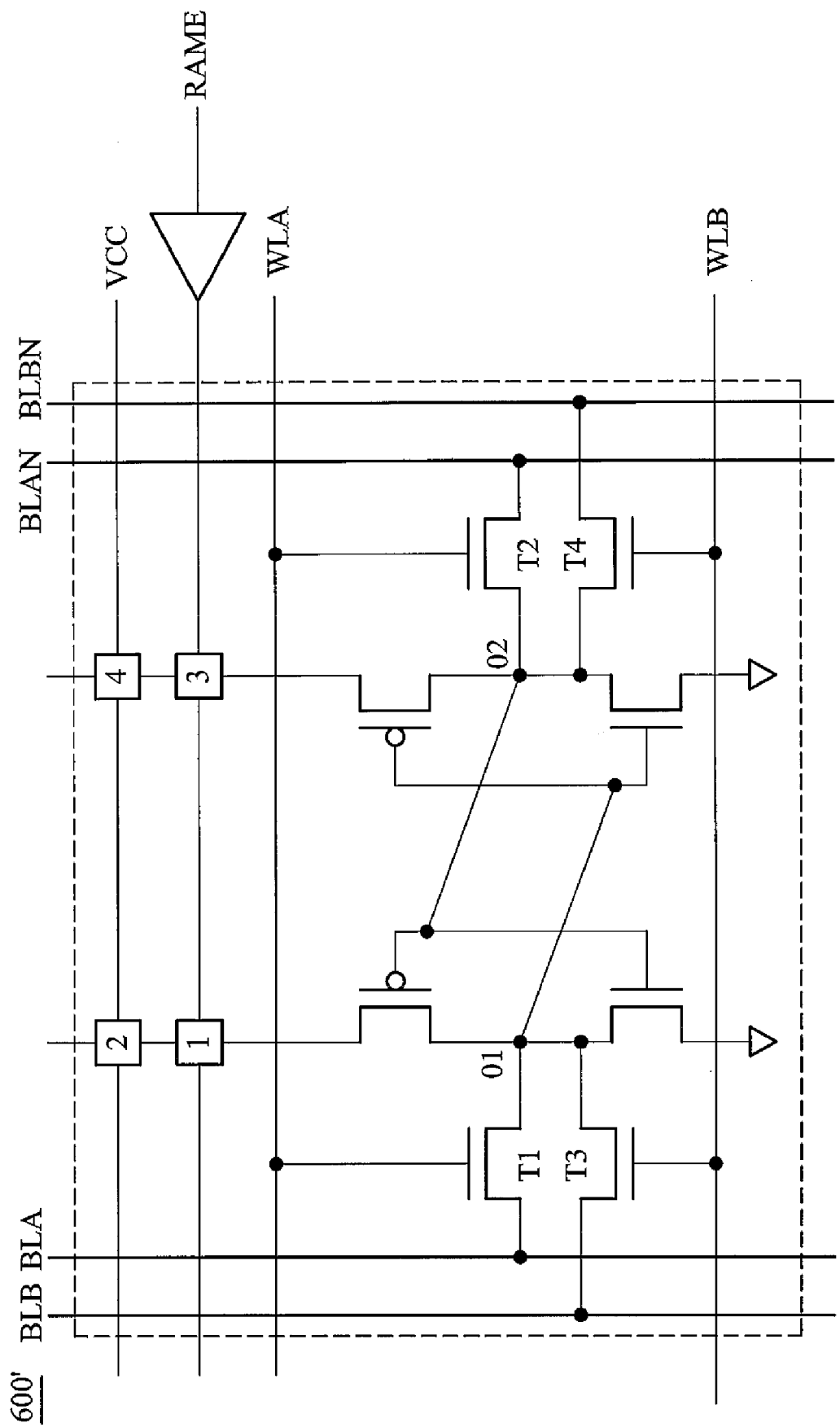
FIG. 6B is a circuit diagram of a variant of the combo memory cell 400 in FIG. 4.

FIG. 6B is a circuit diagram of a variant of the combo memory cell 400 in FIG. 4. The combo memory cell 600' differs from that in FIG. 4 only in that the first access transistor T1 is coupled between a first bit line BLA and the first output node O1 and the second access transistor T2 coupled between a first complementary bit line BLAN and the second output node O2. Gates of the first and second access transistors T1 and T2 are controlled by a first word line WLA. In addition, the combo memory cell 600' further comprises third and fourth access transistors T3 and T4. The third access transistor T3 is coupled between the first output node O1 and a second bit line BLB and the fourth access transistor T4 coupled between the second output node O2 and a second complementary bit line BLBN. Gates of the third and fourth access transistors T3 and T4 are controlled by a second word line WLB.

Figure 7A:
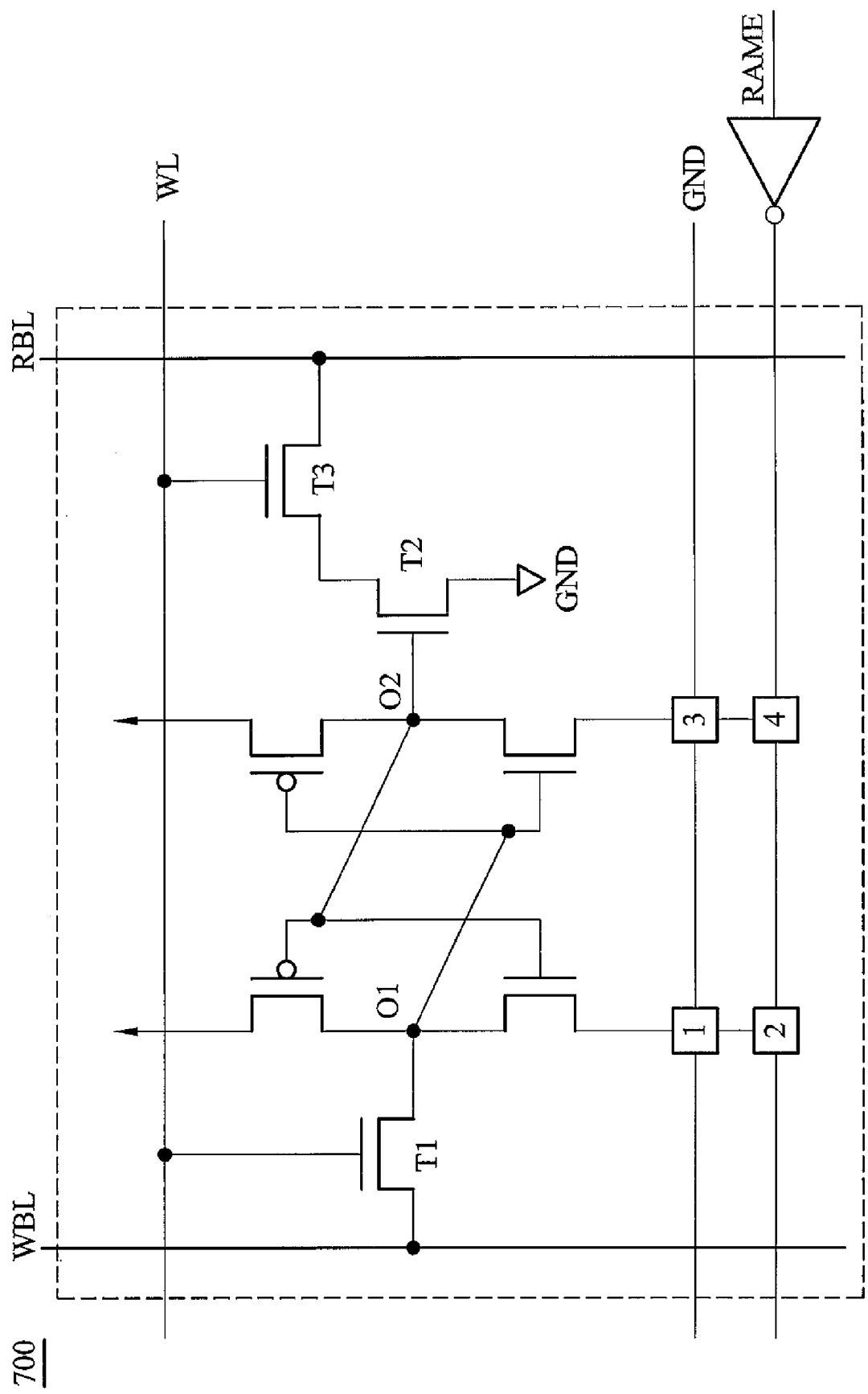
FIG. 7A is a circuit diagram of a variant of the combo memory cell 200 in FIG. 2.

FIG. 7A is a circuit diagram of a variant of the combo memory cell 200 in FIG. 2. The combo memory cell 700 differs from that in FIG. 2 only in that the first access transistor T1 is coupled between a write bit line WBL and the first output node O1. A gate and a source of the second access transistor T2 are respectively coupled to the second output node O2 and the ground GND. The third access transistor T3 is coupled between a drain of the second access transistor T2 and a read bit line RBL. Gates of the first and third access transistors T1 and T3 are controlled by a word line WL.

Figure 7B:
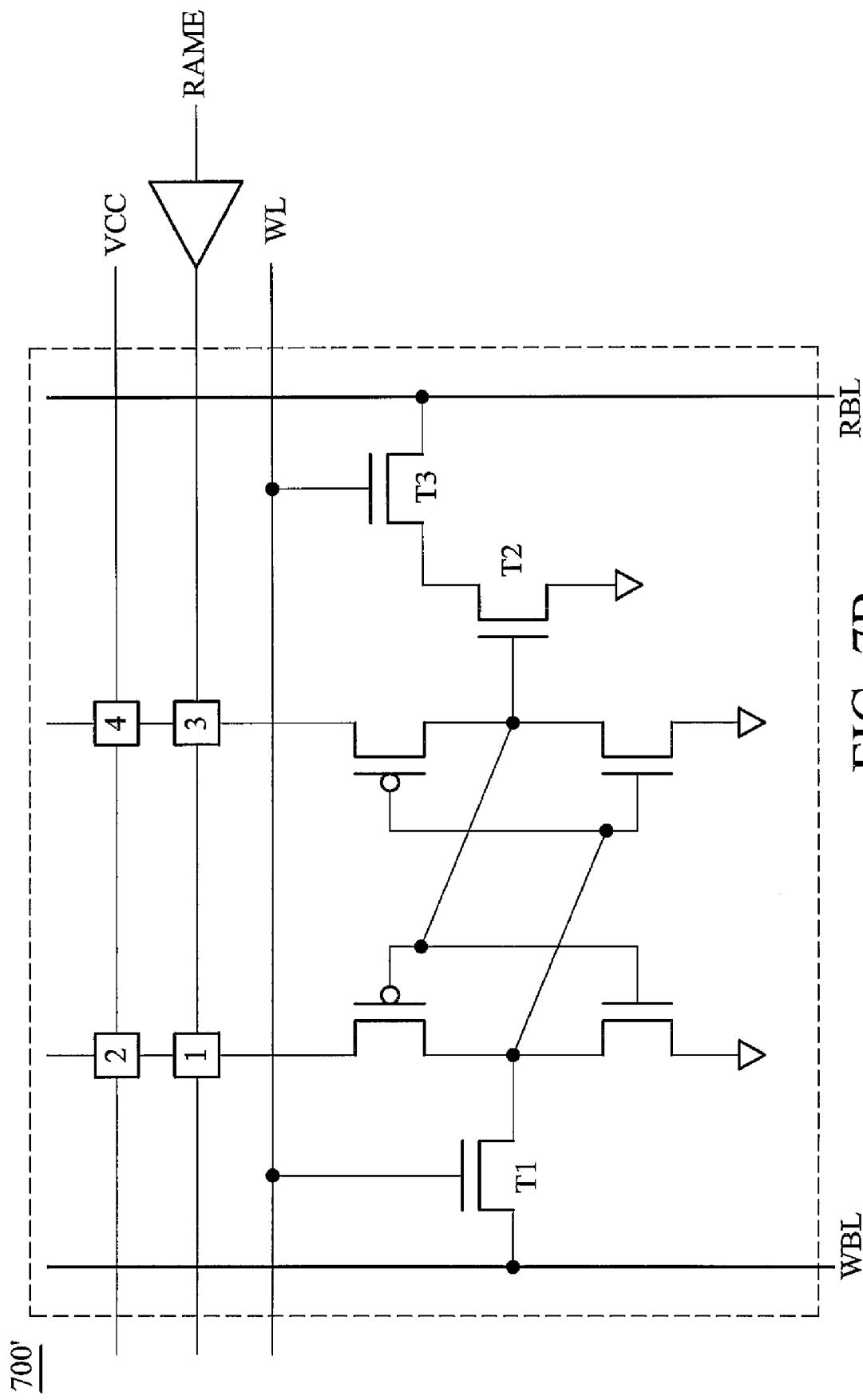
FIG. 7B is a circuit diagram of a variant of the combo memory cell 400 in FIG. 4.

FIG. 7B is a circuit diagram of a variant of the combo memory cell 400 in FIG. 4. The combo memory cell 700' differs from that in FIG. 4 only in that the first access transistor T1 is coupled between a write bit line WBL and the first output node O1. A gate and a source of the second access transistor T2 are respectively coupled to the second output node O2 and the ground GND. The third access transistor T3 is coupled between a drain of the second access transistor T2 and a read bit line RBL. Gates of the first and third access transistors T1 and T3 are controlled by a word line WL.

Figure 8:
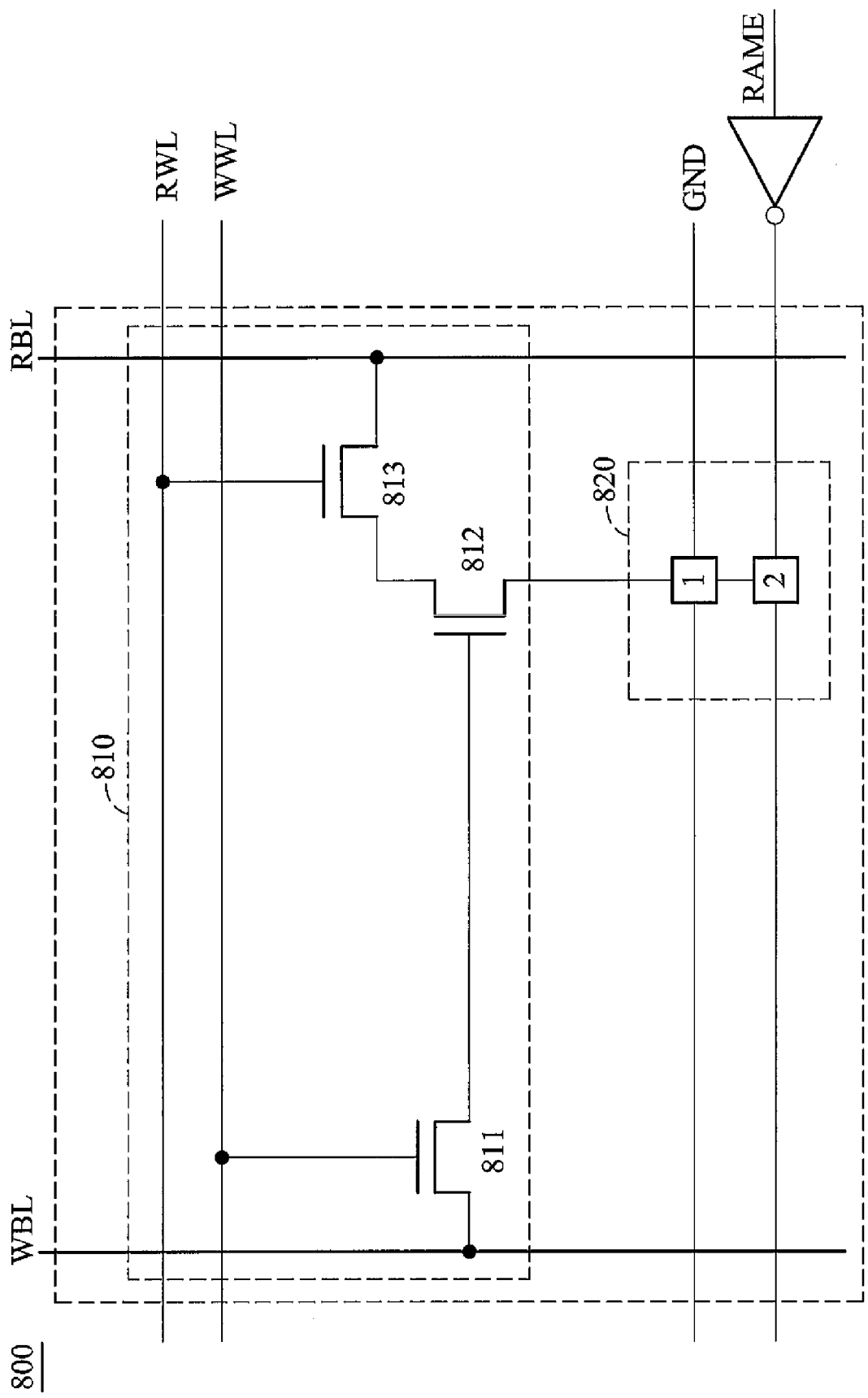
FIG. 8 is a circuit diagram of a combo memory cell according to another embodiment of the invention.

FIG. 8 is a circuit diagram of a combo memory cell according to another embodiment of the invention. The combo memory cell 800 has a random access mode and a read only mode. The combo memory cell also has first and second logic states wherein voltage level of the first logic state Vcc exceeds the second logic state GND. The combo memory cell 800 comprises a static random access memory (SRAM) cell 810 and a mask read only memory (mask-ROM) code programmer 820. The SRAM cell 810 comprises a first MOS transistor 811, a second MOS transistor 812, and a third MOS transistor 813. The first MOS transistor 811 has a source coupled to a write bit line WBL and a gate coupled to a write word line WWL. The second MOS transistor 812 has a gate coupled to a drain of the first MOS transistor 811. The third MOS transistor 813 has a source coupled to a drain of the second MOS transistor 812, a gate coupled to a read word line RWL, and a drain coupled to a read bit line RBL. The mask-ROM code programmer 820 comprises programmable interconnections 1 and 2. The programmable interconnection 1 selectively couples the source of the second MOS transistor 812 to a ground GND. The programmable interconnection 2 selectively couples the source of the second MOS transistor 812 to a control signal RAME (via an inverter). Voltage level of the control signal RAME is the supply voltage Vcc or the ground GND. When the source of the second MOS transistor 812 is coupled to the ground, the combo memory cell 800 is in a random access mode.

Figure 9:
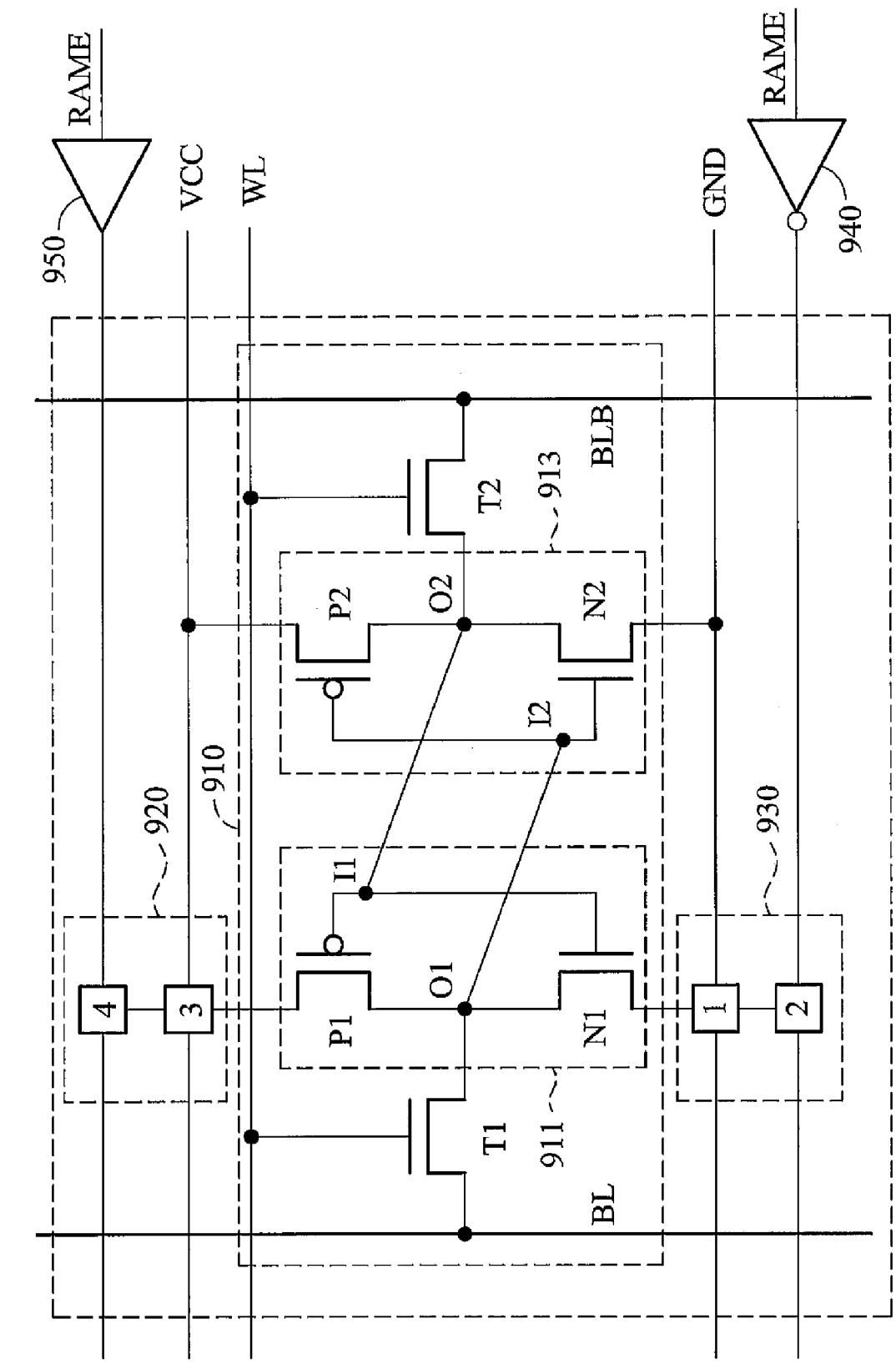
FIG. 9 is a circuit diagram of a combo memory cell according to yet another embodiment of the invention.

FIG. 9 is a circuit diagram of a combo memory cell according to yet another embodiment of the invention. The combo memory cell 900 has a random access mode and a read only mode. The combo memory cell 900 also has first and second logic states wherein voltage level of the first logic state Vcc exceeds the second logic state GND. The combo memory cell 900 comprises a static random access memory (SRAM) cell 910 and first and second mask read only memory (mask-ROM) code programmers 920 and 930. The SRAM cell 910 comprises first and second inverters 911 and 913 and the first and second access transistors T1 and T2. The first inverter 911 comprises a first PMOS transistor P1 and a first NMOS transistor N1. Gates of the first PMOS transistor P1 and the first NMOS transistor N1 are commonly connected to a first input node I1 and drains thereof commonly connected to a first output node O1. The second inverter 913 comprises a second PMOS transistor P2 and a second NMOS transistor N2. Gates of the second PMOS transistor P2 and the second NMOS transistor N2 are commonly connected to a second input node I2 and drains thereof commonly connected to a second output node O2. Sources of the first PMOS transistor P1 and the second PMOS transistor P2 are respectively coupled to the first logic state (a supply voltage Vcc) and the second logic state (a ground GND). The first access transistor T1 is coupled between a bit line BL and the first output node O1 and the second access transistor T2 coupled between a complementary bit line BLB and the second output node O2. Gates of the first and second access transistors T1 and T2 are controlled by a word line WL. The first input node I1 and the second output node O2 are connected, as are the second input node I2 and the first output node O1. The first and second mask-ROM code programmers 920 and 930 are respectively coupled to the sources of the first PMOS transistor P1 and the first NMOS transistors N1. The mask-ROM code programmer 930 comprises programmable interconnections 1 and 2. The programmable interconnection 1 selectively couples the source of the first NMOS transistor N1 to the ground GND. The programmable interconnection 2 selectively couples the source of the first NMOS transistor N1 to a control signal RAME (via an inverter 940). The mask-ROM code programmer 920 comprises programmable interconnections 3 and 4. The programmable interconnection 3 selectively couples the source of the first PMOS transistor P1 to the supply voltage Vcc. The programmable interconnection 4 selectively couples the source of the first PMOS transistor P1 to a control signal RAME (via a buffer 950). The programmable interconnections 1, 2, 3, and 4 can be a diffusion layer, a contact layer, a via layer, a metal layer, or the like.

Figure 10A:
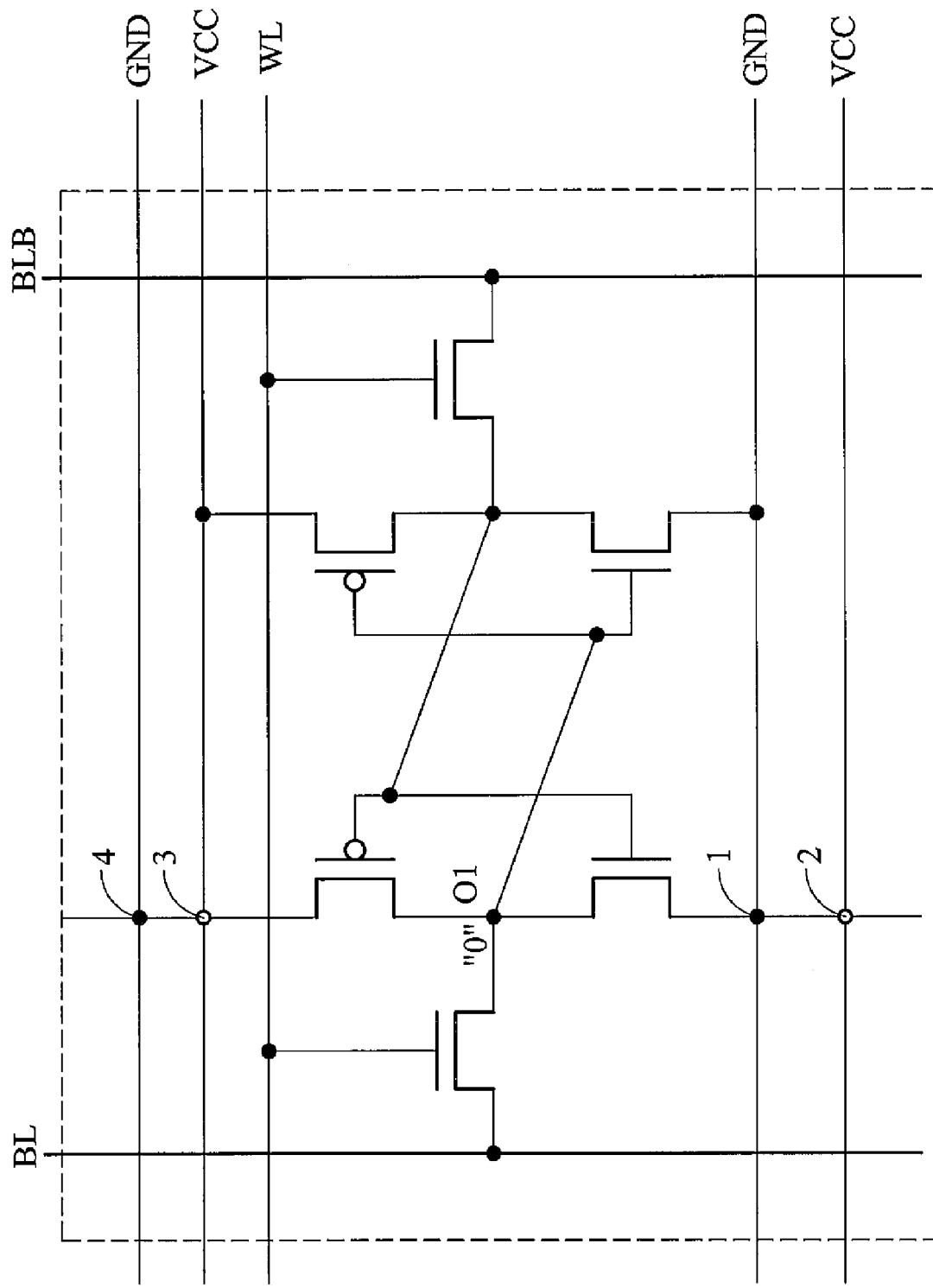
FIGS. 10A and 10B are schematic diagrams of the combo memory cell 900 in FIG. 9 in a read only mode.

FIG. 10A is a schematic diagram of the combo memory cell 900 in FIG. 9 in a read only mode. A logic state of the control signal RAME is "0". The sources of the first PMOS transistor P1 and the first NMOS transistors N1 are coupled to the ground GND or the supply voltage Vcc via the programmable interconnections 1, 2, 3, and 4. In FIG. 10A, the source of the first NMOS transistor N1 is coupled to the ground GND via the programmable interconnection 1 and that of the first PMOS transistor P1 coupled to the ground GND via the programmable interconnection 4. Since two ends of the first inverter 911 are both coupled to the ground GND, a logic state of the first output node O1 is "0", and a logic state of the second output node O2 is "1". As a result, the combo memory cell 900 is in a read only mode and a memory state thereof is "0".

Figure 10B:
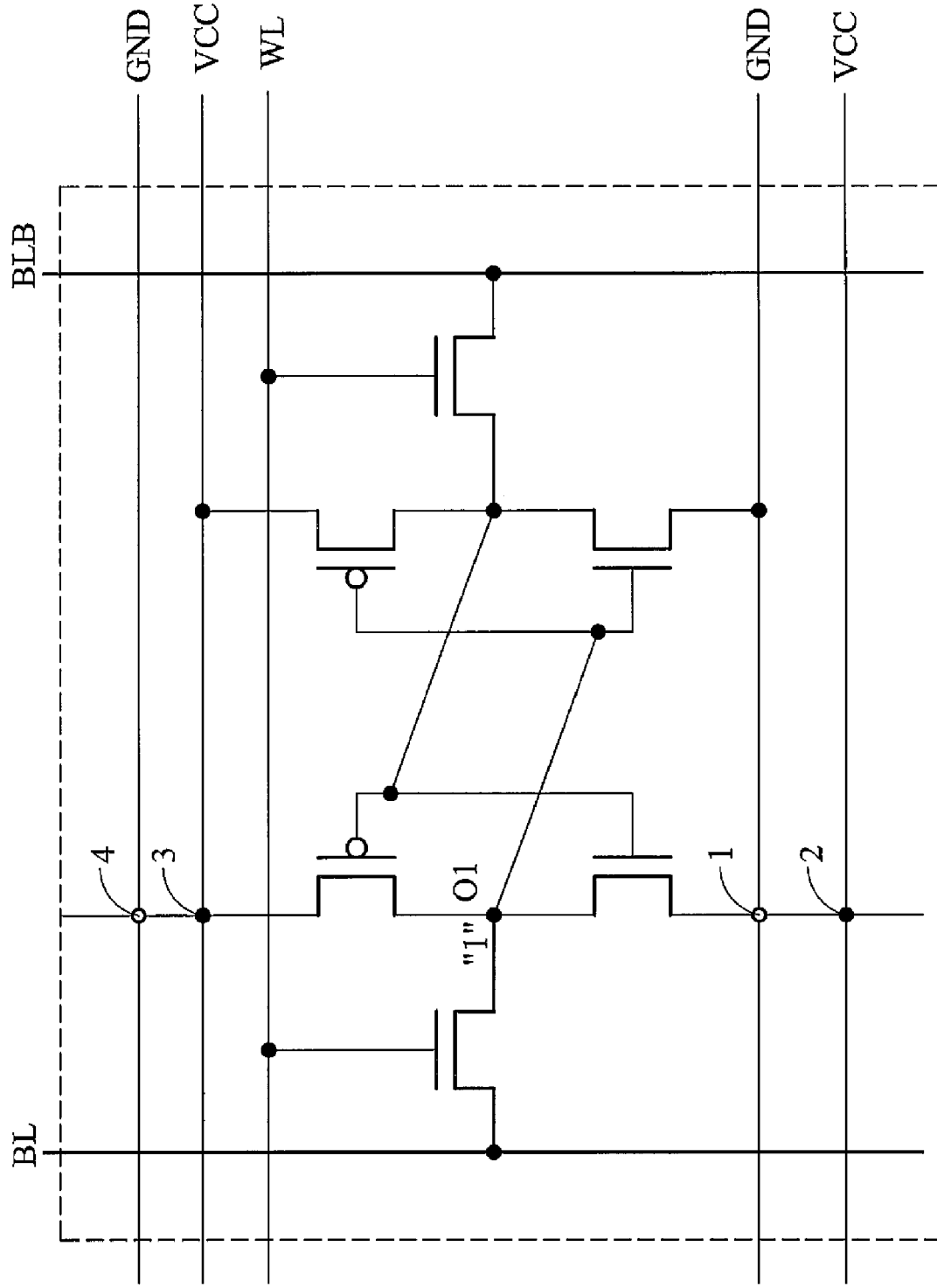

FIG. 10B is a schematic diagram of the combo memory cell 900 in FIG. 9 in a read only mode. A logic state of the control signal RAME is "0". The sources of the first PMOS transistor P1 and the first NMOS transistors N1 are coupled to the ground GND or the supply voltage Vcc via the programmable interconnections 1, 2, 3, and 4. In FIG. 10B, the source of the first NMOS transistor N1 is coupled to the supply voltage Vcc via the programmable interconnection 2 and that of the first PMOS transistor P1 coupled to the supply voltage Vcc via the programmable interconnection 3. Since two ends of the first inverter 911 are both coupled to the supply voltage Vcc, a logic state of the first output node O1 is "1", and a logic state of the second output node O2 is "0". As a result, the combo memory cell 900 is in a read only mode and a memory state thereof is "1".

Figure 10C:
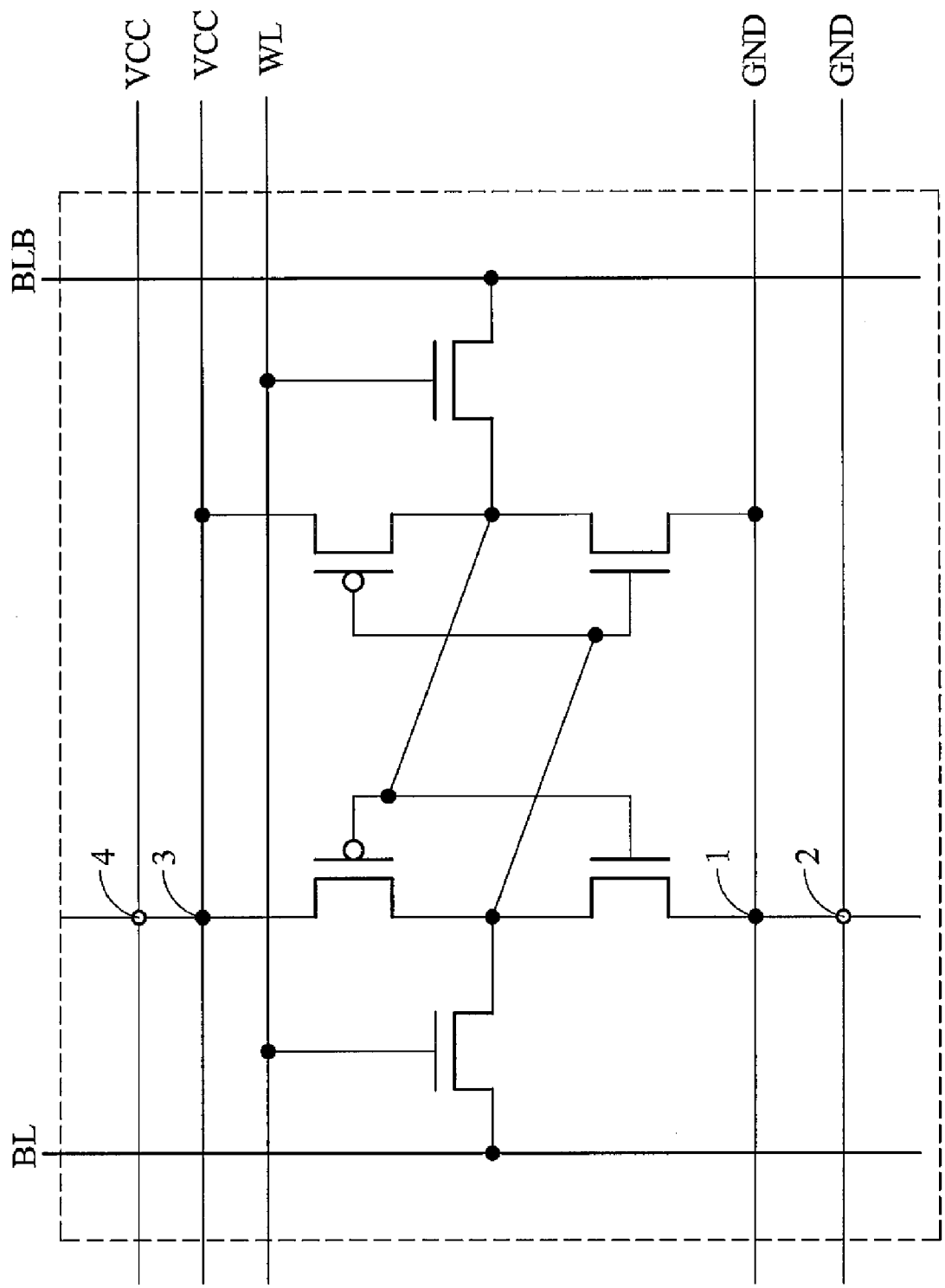
FIG. 10C is a schematic diagram of the combo memory cell 900 in FIG. 9 in a random access mode.

FIG. 10C is a schematic diagram of the combo memory cell 900 in FIG. 9 in a random access mode. A logic state of the control signal RAME is "1". The sources of the first PMOS transistor P1 and the first NMOS transistor N1 are coupled to the ground GND or the supply voltage Vcc via the programmable interconnections 1, 2, 3, and 4. In FIG. 10C, the source of the first PMOS transistor P1 is coupled to the supply voltage Vcc via the programmable interconnection 3 and that of the first NMOS transistor N1 coupled to ground GND via the programmable interconnection 1. Thus, a configuration of the combo memory cell 900 is the same as a 6T static random access memory (6T-SRAM). As a result, the combo memory cell 900 is in a random access mode.

Figure 11:
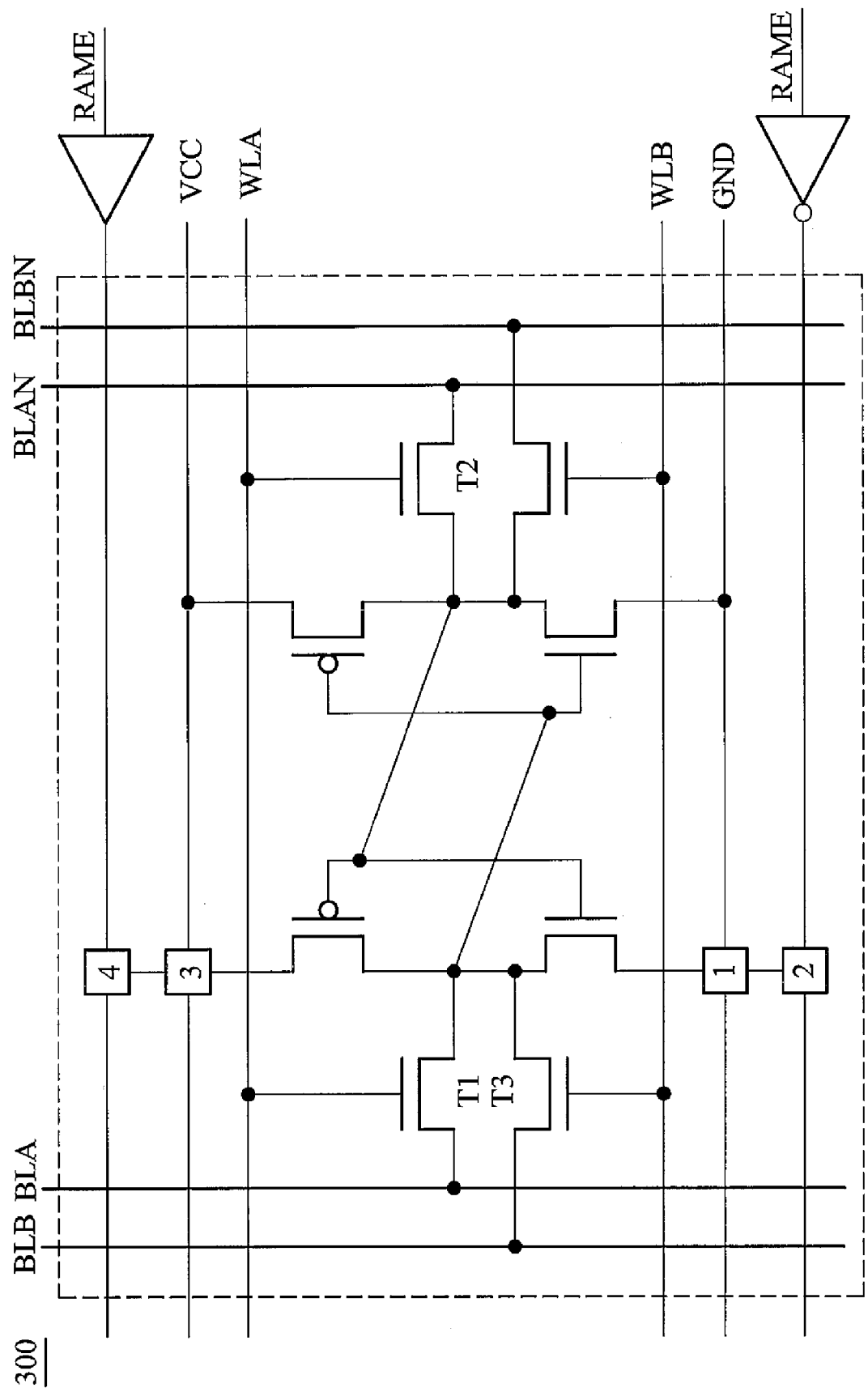
FIG. 11 is a circuit diagram of a variant of the combo memory cell 900 in FIG. 9.

FIG. 11 is a circuit diagram of a variant of the combo memory cell 900 in FIG. 9. The combo memory cell 300 differs from that in FIG. 9 only in that the first access transistor T1 is coupled between a first bit line BLA and the first output node O1 and the second access transistor T2 coupled between a first complementary bit line BLAN and the second output node O2. Gates of the first and second access transistors T1 and T2 are controlled by a first word line WLA. In addition, the combo memory cell 300 further comprises third and fourth access transistors T3 and T4. The third access transistor T3 is coupled between the first output node O1 and a second bit line BLB and the fourth access transistor T4 coupled between the second output node O2 and a second complementary bit line BLBN. Gates of the third and fourth access transistors T3 and T4 are controlled by a second word line WLB.

Figure 12:
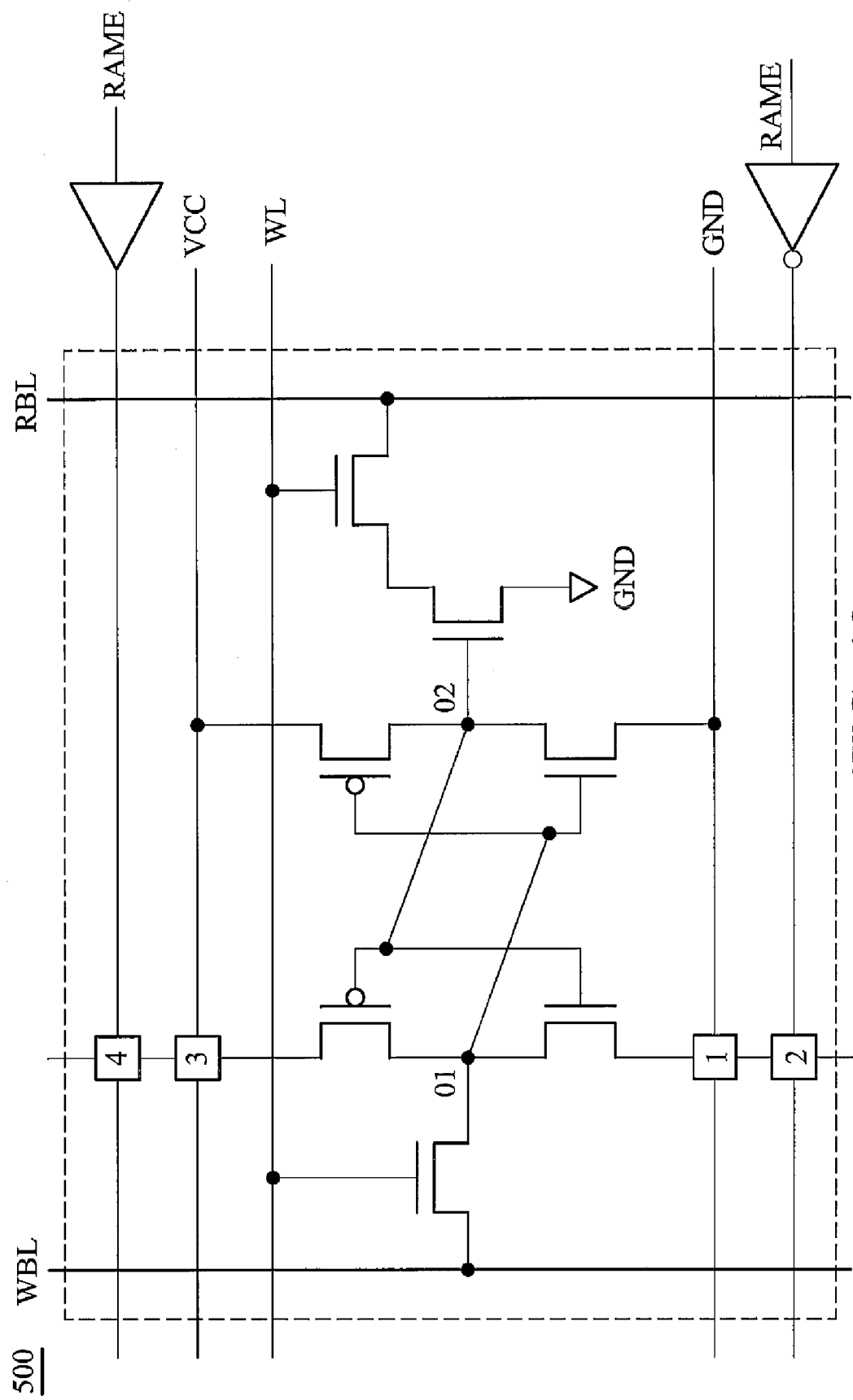
FIG. 12 is a circuit diagram of a variant of the combo memory cell 900 in FIG. 9.

FIG. 12 is a circuit diagram of a variant of the combo memory cell 900 in FIG. 9. The combo memory cell 500 differs from that in FIG. 9 only in that the first access transistor T1 is coupled between a write bit line WBL and the first output node O1. A gate and a source of the second access transistor T2 are respectively coupled to the second output node O2 and the ground GND. The third access transistor T3 is coupled between a drain of the second access transistor T2 and a read bit line RBL. Gates of the first and third access transistors T1 and T3 are controlled by a word line WL.

While the invention has been described by way of example and in terms of preferred embodiment, it is to be understood that the invention is not limited thereto, and it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A combo memory cell having a random access mode and a read only mode and first and second logic states wherein voltage level of the first logic state exceeds the second logic state, comprising:

a static random access memory cell, comprising:
a first inverter comprising a first PMOS transistor and a first NMOS transistor, with gates thereof commonly connected to a first input node and drains thereof commonly connected to a first output node; and
a second inverter comprising a second PMOS transistor and a second NMOS transistor, with gates thereof commonly connected to a second input node and drains thereof commonly connected to a second output node;
wherein the first input node and the second output node are connected, as are the second input node and the first output node; and
a mask read only memory (mask-ROM) code programmer coupled to the sources of the first and second PMOS transistors or the first and second NMOS transistors.

2. The combo memory cell as claimed in claim 1, wherein the sources of the first and second PMOS transistors are coupled to the voltage level of the first logic state via the mask-ROM code programmer such that the combo memory cell is in the random access mode.

3. The combo memory cell as claimed in claim 1, wherein the sources of the first and second NMOS transistors are coupled to the voltage level of the second logic state via the mask-ROM code programmer such that the combo memory cell is in the random access mode.

4. The combo memory cell as claimed in claim 1, wherein the sources of the first and second NMOS transistors are respectively coupled to the voltage levels of the first and second logic states via the mask-ROM code programmer such that the combo memory cell is in the read only mode.

5. The combo memory cell as claimed in claim 1, wherein the sources of the first and second PMOS transistors are respectively coupled to the voltage levels of the first and second logic states via the mask-ROM code programmer such that the combo memory cell is in the read only mode.

6. The combo memory cell as claimed in claim 1, wherein the mask-ROM code programmer is programmed via a diffusion layer, a contact layer, a via layer, a metal layer, or the like and a control signal.

7. The combo memory cell as claimed in claim 1, further comprising first and second access transistors, wherein the first access transistor is coupled between a first bit line and the first output node, the second access transistor is coupled between a first complementary bit line and the second output node, and gates of the first and second access transistors are controlled by a first word line.

8. The combo memory cell as claimed in claim 7, further comprising third and fourth access transistors, wherein the third access transistor is coupled between a second bit line and the first output node, the fourth access transistor is coupled between a second complementary bit line and the second output node, and gates of the third and fourth access transistors are controlled by a second word line.

9. The combo memory cell as claimed in claim 1, further comprising first, second, and third access transistors, wherein the first access transistor is coupled between a write bit line and the first output node, a gate and a source of the second access transistor are respectively coupled to the second output node and a ground, and the third access transistor is coupled between a drain of the second access transistor and a read bit line, wherein gates of the first and third access transistors are controlled by a word line.

10. A combo memory cell having a random access mode and a read only mode and first and second logic states wherein voltage level of the first logic state exceeds the second logic state, comprising:
a static random access memory cell, comprising:
a first inverter comprising a first PMOS transistor and a first NMOS transistor, with gates thereof commonly connected to a first input node and drains thereof commonly connected to a first output node; and
a second inverter comprising a second PMOS transistor and a second NMOS transistor, with gates thereof commonly connected to a second input node and drains thereof commonly connected to a second output node;
wherein the first input node and the second output node are connected, as are the second input node and the first output node; and
first and second mask-ROM code programmers respectively coupled to the sources of the first PMOS and NMOS transistors.

11. The combo memory cell as claimed in claim 10, wherein the source of the first PMOS transistor is coupled to the voltage level of the first logic state via the first mask-ROM code programmer and that of the first NMOS transistor coupled to that of the second logic state via the second mask-ROM code programmer such that the combo memory cell is in the random access mode.

12. The combo memory cell as claimed in claim 10, wherein the sources of the first PMOS and NMOS transistors are coupled to the voltage level of the first logic state via the first and second mask-ROM code programmers such that the combo memory cell is in the read only mode.

13. The combo memory cell as claimed in claim 10, wherein the sources of the first PMOS and NMOS transistors are coupled to the voltage level of the second logic state via the first and second mask-ROM code programmers such that the combo memory cell is in the read only mode.

14. The combo memory cell as claimed in claim 10, wherein the first and second mask-ROM code programmers are programmed via a diffusion layer, a contact layer, a via layer, a metal layer, or the like and a control signal.

15. The combo memory cell as claimed in claim 10, further comprising first and second access transistors, wherein the first access transistor is coupled between a first bit line and the first output node, the second access transistor is coupled between a first complementary bit line and the second output node, and gates of the first and second access transistors are controlled by a first word line.

16. The combo memory cell as claimed in claim 15, further comprising third and fourth access transistors, wherein the third access transistor is coupled between a second bit line and the first output node, the fourth access transistor is coupled between a second complementary bit line and the second output node, and gates of the third and fourth access transistors are controlled by a second word line.

17. The combo memory cell as claimed in claim 10, further comprising first, second, and third access transistors, wherein the first access transistor is coupled between a write bit line and the first output node, a gate and a source of the second access transistor are respectively coupled to the second output node and a ground, and the third access transistor is coupled between a drain of the second access transistor and a read bit line, wherein gates of the first and third access transistors are controlled by a word line.

18. A combo memory cell having a random access mode and a read only mode and first and second logic states wherein voltage level of the first logic state exceeds the second logic state, comprising:
a static random access memory cell, comprising:
a first MOS transistor having a source coupled to a write bit line and a gate coupled to a write word line;
a second MOS transistor having a gate coupled to a drain of the first MOS transistor; and
a third MOS transistor having a source coupled to a drain of the second MOS transistor, a gate coupled to a read word line, and a drain coupled to a read bit line; and
a mask-ROM code programmer coupled to the source of the second MOS transistor.

19. The combo memory cell as claimed in claim 18, wherein the mask-ROM code programmer comprises first and second programmable interconnections selectively coupling the source of the second MOS transistor to the voltage level of the first logic state or the second logic state.

20. The combo memory cell as claimed in claim 19, wherein the source of the second MOS transistor is coupled to the voltage level of the second logic state such that the combo memory cell is in the random access mode.

* * * * *